March 31, 1959 P. S. PETERSEN 2,879,585
MACHINE FOR MOUNTING ELECTRICAL COMPONENT
CONTAINERS ON CIRCUIT BOARDS
Filed April 22, 1955 3 Sheets-Sheet 1

INVENTOR.
PAUL S. PETERSEN
BY
William C. Stueber
ATTORNEY

March 31, 1959 P. S. PETERSEN 2,879,585

MACHINE FOR MOUNTING ELECTRICAL COMPONENT CONTAINERS ON CIRCUIT BOARDS

Filed April 22, 1955 3 Sheets-Sheet 2

INVENTOR.
PAUL S. PETERSEN
BY William C. Stueber
ATTORNEY

INVENTOR.
PAUL S. PETERSEN
BY William C. Stueber
ATTORNEY 2,879,585

MACHINE FOR MOUNTING ELECTRICAL COMPONENT CONTAINERS ON CIRCUIT BOARDS

Paul S. Petersen, St. Louis Park, Minn., assignor to General Mills, Inc., a corporation of Delaware Application April 22, 1955, Serial No. 503,106

2 Claims. (Cl. 29—203)

The present invention relates to machines for mounting electrical component containers on a circuit board and electrically attaching the components to the board.

In the advance of the electrical manufacturing art, electronic circuits for radios, television, and other electronic equipment have used printed circuit boards for certain portions of the circuitry to replace circuits which were formerly formed with wires extending between terminals or between the leads of the components. These circuit boards are formed of insulating material and have the printed circuitry in the form of lines or strips of conducting material either sprayed or printed on the surface of the board, embedded in the insulating material of the board, or affixed thereto by a number of methods.

To complete the printed circuit board and form a continuous operative circuit, electrical components such as condensers, resistors, transformers, coils and the like are attached between the ends of the conducting strips which appear on the circuit board. For this purpose, holes are usually formed in the circuit board at the end of the conducting strips. The electrical component leads are inserted into the holes and soldered to the end of the conducting strips.

In certain electrical circuits, the electrical components are sometimes placed in containers and the containers are physically attached to the board. These containers are mounted directly on the circuit board with the leads from the electrical components within the containers being attached to the ends of the conducting strips on the board. An example of this arrangement is in a radio employing a superheterodyne circuit which utilizes intermediate frequency coils, which in their commercial form are contained in metal cans with the leads extending from the bottom of the cans.

The present invention contemplates a machine and method which will mount component containers such as I.-F. cans on a printed circuit board by physically attaching the cans to the board so that it may be handled and used without the cans becoming detached from the circuit board, and by electrically attaching the leads from the I.-F. cans to the ends of the conducting strips.

It is accordingly an object of the present invention to provide an improved method and machine for attaching I.-F. cans or the like to a circuit board, the machine having a minimum of operating parts and being susceptible of rapid continuous operation so that it may be used on automatic assembly machinery which assembles a complete circuit board attaching all the various necessary electrical components to the board.

Another object of the invention is to provide an improved machine which will automatically feed individual I.-F. cans from a supply magazine, individually mount the cans in the proper position on a circuit board without damaging the I.-F. cans or the transformer contained therein, and provide a secure physical and electrical connection between the transformer can and the I.-F. coils and the circuit board.

Another object of the invention is to provide a machine which will receive I.-F. cans stacked horizontally in a magazine and automatically erect them and secure them to a circuit board.

Other objects and advantages will become more apparent in the following description and claims taken in connection with the appended drawings in which:

Figures 1, 2:
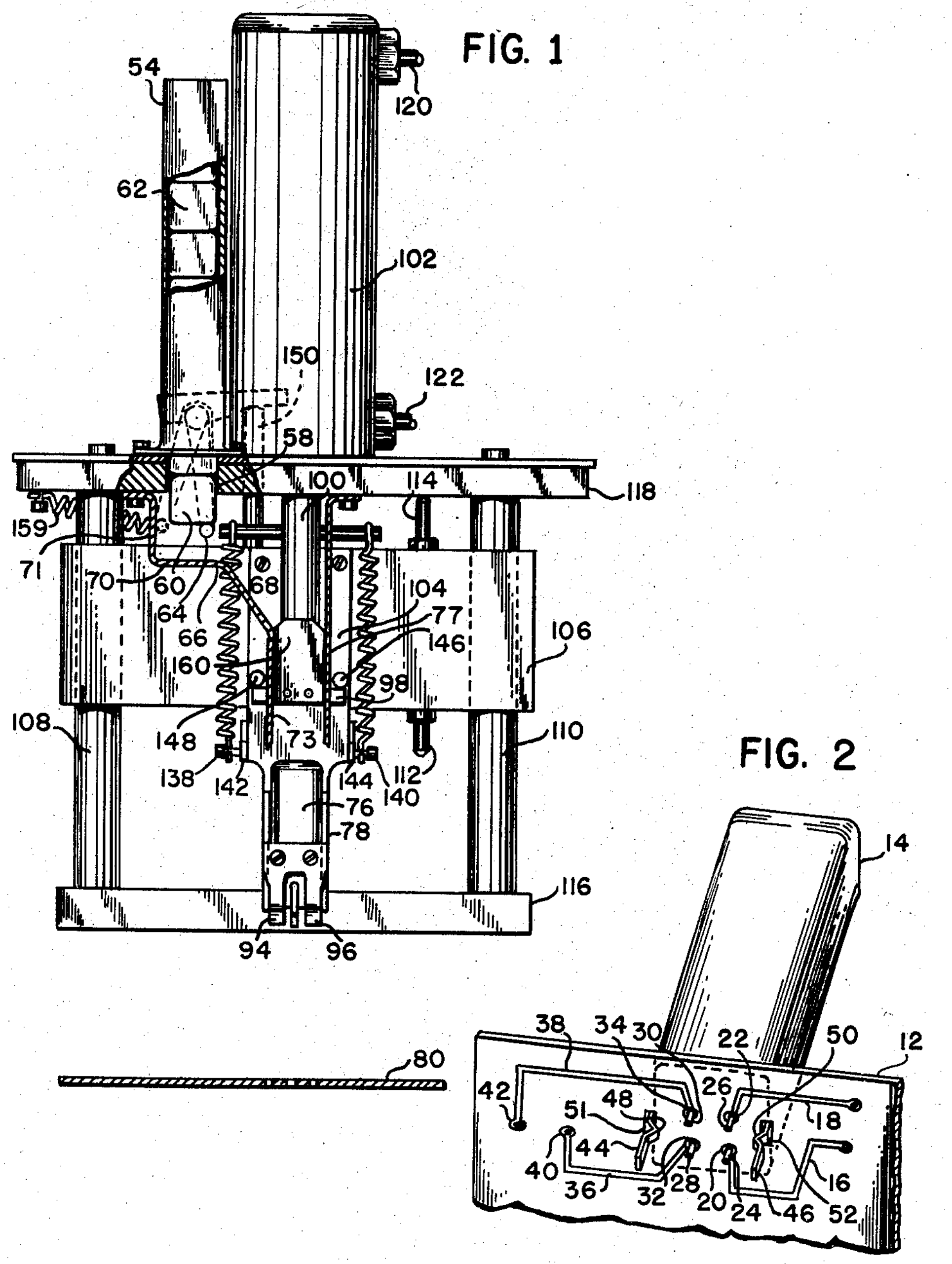
Figure 1 is a front elevational view of a mechanism for attaching transformer containers.
Fig. 2 is a perspective view of a part of a circuit board illustrating a transformer can attached to the board.

In Fig. 2 a portion of a circuit board 12 is illustrated with the electrical component container 14 mounted on the board. It will be noted from the appearance of the lower surface of the circuit board that electrical conducting strips such as 16 and 18 are embedded or otherwise attached to the insulating material of the board. These conducting strips terminate at holes 20 and 22 through which leads or terminals 24 and 26 of the electrical component are inserted.

Although for convenience of description, the electrical component herein referred to is an intermediate frequency transformer, commonly referred to as an I.-F. transformer, it will be understood that any other type of component may be mounted on the circuit board with the present mechanism and that the container 14 as shown may be a container for any type of electrical component. The leads 24, 26, 28, and 30 may belong to any electrical component which is mounted and protected within the container.

The electrical component or I.-F. transformer has terminals or leads 24, 26, 28, and 30 which, when the can is in mounted position, project through the holes 20, 22, 32, and 34, respectively. The holes are located in the board at the end of the conducting strips 16, 18, 36, and 38, respectively. The conducting strips 16, 18, 36, and 38 each terminate at other holes such as the holes 40 and 42 shown at the ends of conducting strips 36 and 38. Other electrical components, such as resistors, may be attached at the other end of the conducting strips by having their leads projected through the holes and soldered to the strips.

In general practice when all of the component leads are projected through the holes in the circuit board, the leads are soldered to the ends of the conducting strips for insuring a positive electrical connection. This may be accomplished by hand soldering or by dipping the entire board surface in molten solder, whereupon the solder adheres only to the metal portions and not to the insulated board.

To physically secure the transformer can to the circuit board a pair of spring clips 44 and 46 are provided which are biased inwardly toward each other and are connected to opposing sides of the can 14. Each of these spring clips has a projecting shoulder 48 and 50 which locks beneath the circuit board as the clips 44 and 46 are projected completely into the holes 51 and 52 in the circuit board. These holes are provided solely for the purpose of locking the can to the board and are spaced from the conducting lines on the board so that the clips will not accidentally short circuit the lines.

The spring clips 44 and 46 are shaped with the ends spaced apart the same distance as the holes so that when the I.-F. can is lowered onto the circuit board, the ends will freely enter the holes 51 and 52 and the locking shoulders 48 and 50 will grip the underside of the board adjacent the holes.

At the same time that the spring clips enter the holes in the board to lock the can on the board surface, the leads or terminals 24, 26, 28, and 30 are being inserted into the holes in the board. The transformer container illustrated is chosen to have leads in the form of rigid prongs and to have locking clips of the type shown. Although other types of transformer containers are commercially available, the container illustrated is well suited to attachment with a machine embodying the principles of the present invention. In any event, the circuit board is constructed so that the contact holes 20, 22, 32, and 34 are spaced in accordance with the terminals of the I.-F. transformer which is used and the locking holes 51 and 52 are positioned in accordance with the locking clips.

Figures 3, 4:
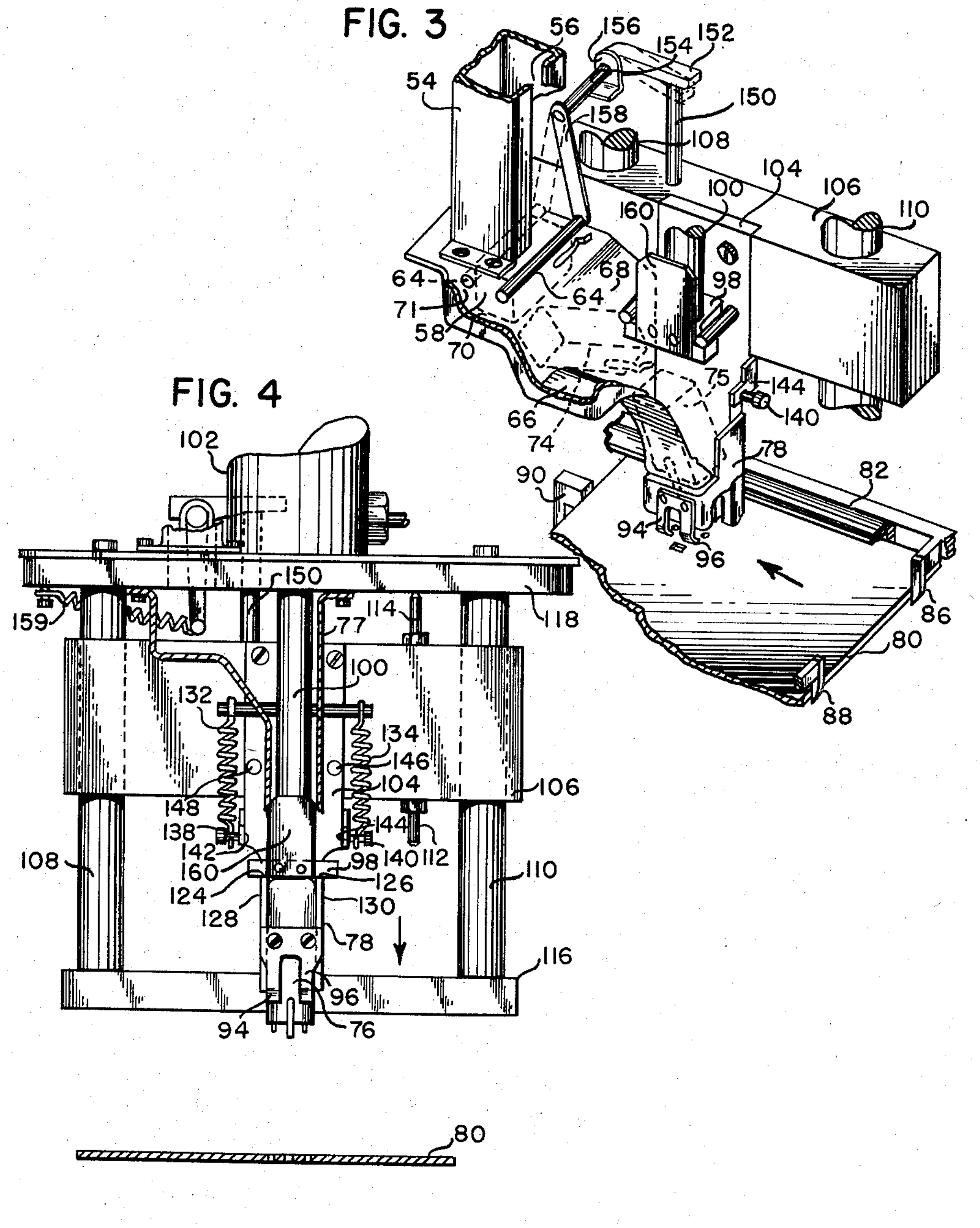
Fig. 3 is a perspective view of the mechanism for attaching the cans to a circuit board, shown to particularly illustrate the path of travel of the cans as they are fed from the magazine and erected.
Fig. 4 is a front elevational view of the mechanism of Fig. 1 shown with the can attaching apparatus beginning its descent for mounting the can on the circuit board.

As illustrated in Figs. 1 and 3, a magazine 54 is provided for containing a supply of I.-F. cans. For purposes of saving space and to protect the terminals at the bottom of the I.-F. cans, the cans are stacked horizontally. Because the cans must be mounted vertically on the circuit board, it is required that the cans be removed from the magazine and turned so that they are in erect position.

The mounted magazine 54 is shown as mounted on the frame 118 which has an opening through which the cans pass to rest on the floor 70, Figs. 1 and 3. As shown in Fig. 3, the floor is connected to a vertical wall at one side of the lowermost can 58. There is no wall at the other side of the can 58 so that it may be removed from beneath the stack of cans.

Figures 5, 6, 7:
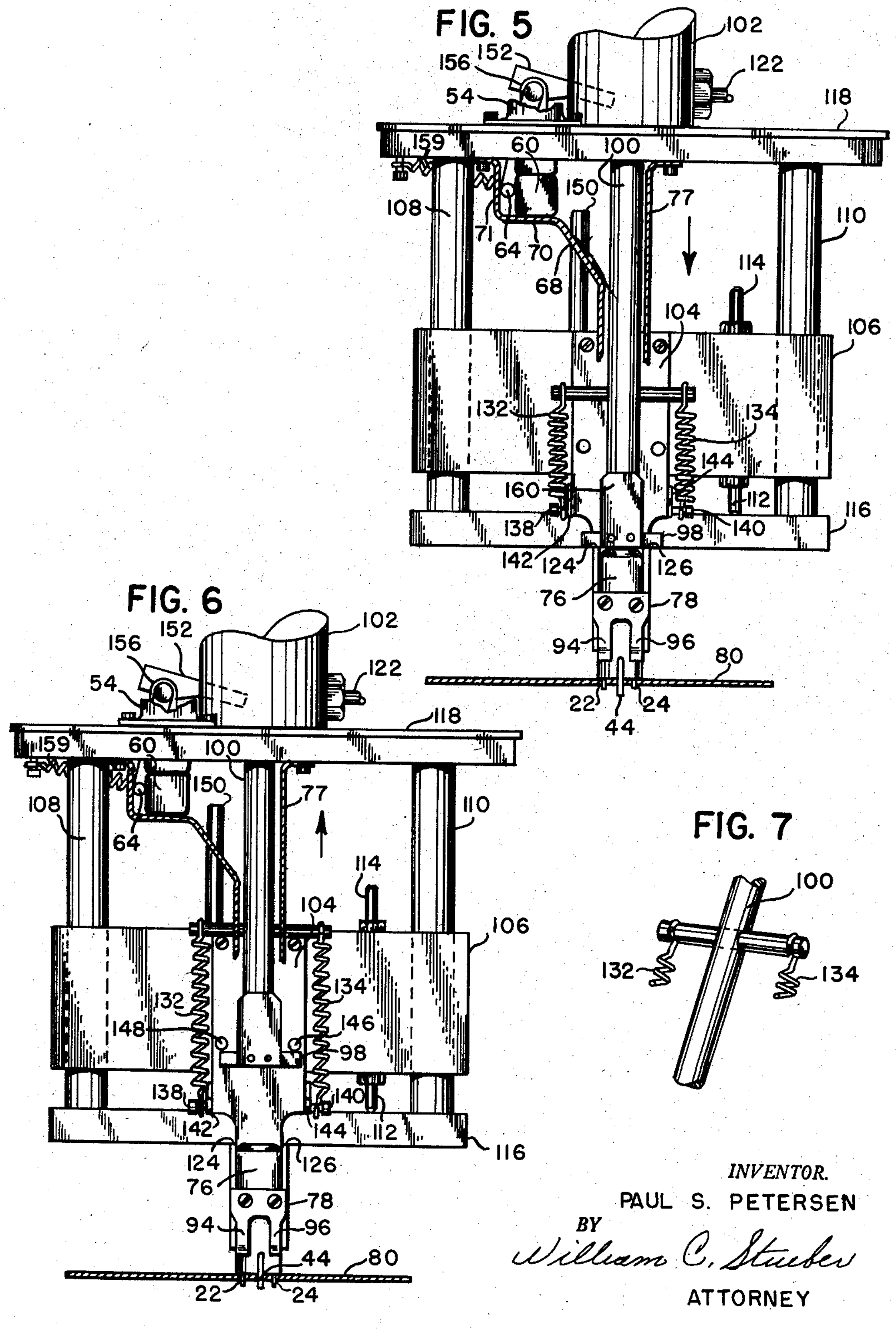
Fig. 5 is another front elevational view showing the apparatus having mounted the can on the board.
Fig. 6 is another front elevational view showing the apparatus as it begins to ascend toward its return position in preparation for receiving another can.
Fig. 7 is an enlarged detail illustrating the connection between parts.

For this purpose a feeder bar 64 is positioned opposite the lowermost can 58 in the dotted line position of Fig. 3 and the solid line position of Figs. 5 and 6. The purpose of this feeder bar is to kick the lowermost can out from beneath the stack of cans to cause it to slide down the waterfall chute 66.

The can delivery chute, as may be best illustrated in Fig. 3, is comprised of two portions with the upper portion 68 leading slopingly downward from the can supporting floor 70. After the can 58 has slid down the first chute, its direction of slide is abruptly changed as it reaches the second waterfall chute 72. In the first chute 68 the can will slide sideways and upon reaching the second waterfall chute, its direction of slide will change to a longitudinal slide with the bottom end of the can being foremost. In the first chute 68, the can will be moved by the action of lever 64 down chute 65. The foremost portion of the can, as viewed in Fig. 3, strikes chute 66, and the can in effect pivots about the upper portion of chute 66 so that the end of the can is carried by gravity down the chute 66 into a position as indicated by 75 of Fig. 3. As the can changes direction in the position shown by the dotted line can 74 of Fig. 3, it slides down the waterfall chute 66 and is erected. The can slides from dotted line position 74 of Fig. 3 to position 75 to be erected and stops in the can positioning box 78, Fig. 1, which supports the can until it is pushed downwardly to be mounted on the circuit board.

The waterfall chute consists of the downwardly curved floor 66 and side walls which guide the transformer can downwardly and hold it in the chute. One side wall 73, as is shown in Fig. 1, is connected to the first sloping chute 68. The other side wall 77 extends downwardly from the frame piece 118 and is bolted thereto.

The circuit board 80 is shown in position in Figs. 1, 3, and 4 beneath the positioning box ready to receive the transformer can. The circuit board shown is one of a series of boards which are positioned beneath the mounting machine, with the mounting machine operating once to attach a new transformer can to each board which is brought beneath it. In the preferred embodiment, the circuit board is guided and also positioned by guide rails such as 82 in Fig. 3, which guide the series of circuit boards beneath the mounting mechanism. For moving the circuit boards to the position shown by the board 80 a pair of pusher fingers 86 and 88 are provided carried by a conveyor chain not shown. Subsequent pusher fingers carry the succeeding boards to the mounting position. A stop 90 may be provided to determine the position at which the board is stopped beneath the mounting mechanism.

Turning now to the attaching and mounting mechanism itself, the transformer can is held in the positioning box 78 by a pair of spring fingers 94 and 96 which project beneath the box into the box opening. The positioning box which supports the transformer can above the printed circuit board before it is mounted thereon, is four sided, being slightly larger than the rectangular can, and is open at both ends so that the can can be pushed therethrough. The spring fingers 94 and 96 engage the lower edge of the transformer can and prevent it from dropping through the box when the can is in the position of Fig. 1. They also frictionally press against the wall of the can as it is pushed downwardly in the positioning box.

For purposes of pushing the I.-F. can downwardly against the circuit board, a pusher block 98 is located above the transformer can in its position in the positioning box 78. The pusher block is supported at the lower end of a piston rod 100 which connects to a piston not shown within an air cylinder 102 illustrated in Fig. 1.

The positioning box 78 is supported on a vertical plate 104 which is secured to a sliding yoke or crosshead 106. The yoke as illustrated in Figs. 1 and 3 is mounted for vertical sliding movement on a pair of vertical guide posts 108 and 110. The frame pieces 116 and 118 provide end supports for the guide posts 108 and 110. The sliding limits of the yoke are fixed by adjustable stops 112 and 114 which are adjustably threaded into the yoke. Thus as the yoke 106 slides downwardly, the stop 112 will strike the frame piece 116 as illustrated in Fig. 5. At the uppermost position, the stop 114 will strike the upper frame piece 118 as shown in Figs. 1 and 4.

Turning now to the action of the mechanism in mounting a transformer can on the circuit board, the bottom can 58 is dislodged from beneath the stack of cans in the magazine as shown in Fig. 3 and falls down the chute 68 and the waterfall chute 66. As the can falls into an upright position in the positioning box, the pusher block 98 descends to engage the top of the transformer can, as is illustrated in Fig. 4. For this action, the pusher block 98 is caused to descend by the piston rod 100 descending. The piston and rod are caused to descend by admitting air into the top of the cylinder 102 through the air line 120 and at the same time the air line 122 in the lower end of the cylinder is vented. For again raising the piston rod, pressurized air is admitted to the line 122 and the line 120 is vented. This may be accomplished by a standard valve arrangement, not shown, connected to a source of pressurized air.

In the automatic operation of the machine, the valve may be controlled by a cam or other timer arrangement which works in synchronization with the delivery mechanism for bringing the individual circuit boards beneath the mounting mechanism. Thus the valve will cause air pressure to be admitted to the cylinder 102 through the air lines 120 to cause the pusher block to descend each time a board is brought into mounting position. When the transformer can is mounted the piston and its associated pusher block 98 will again ascend. For this purpose the valve will cause air pressure to be admitted into the bottom of the cylinder and the valve will be operated automatically either by the timer or cam arrangement above referred to, or by a switch or valve arrangement which is engaged by the yoke, the pusher, or the transformer can itself when the can is properly attached to the board.

Returning now to the descending pusher block 98, it will be seen from Fig. 4 that as the block descends from the position of Fig. 1 to that of Fig. 4, it engages the top of the can and pushes the transformer can down into the positioning box 78 until the lower face of the block strikes the upper shoulders 124 and 126 of the sides 128 and 130 of the box.

When the pusher block engages these shoulders 124 and 126, it begins to force the positioning box downwardly. The transformer can will not fall out of the positioning box since it is held firmly in position by the spring fingers 94 and 96 which press against the side of the can.

In the upper position of Fig. 1, the top surface of the pusher block 98 pushes upwardly against the lifting stops 146 and 148 which are secured to the box supporting plate 104. The positioning box 78 will not descend by its own weight when the pusher block 98 begins to descend to the position of Fig. 4 because of its being held upwardly by the counterbalancing tension springs 132 and 134. The upper ends of the springs are connected to a cross pin 136 which is secured to the piston rod 100 in the manner shown in Fig. 7. Small studs 138 and 140 project outwardly from brackets 142 and 144 connected to the sides of the box supporting plate 104 and the lower ends of the spring connect to these studs. The box will not descend by its own weight because of the springs 132 and 134 pulling upwardly to counterbalance its weight.

As the piston rod 100 continues to descend, the pusher block 98 engages the shoulders 124 and 126 and forces the box and the transformer can contained therein downwardly toward the circuit board to the position of Fig. 5. In Fig. 5, the transformer can has been mounted and the spring clips 44 and 46 on the transformer have entered the holes in the circuit board and have snapped into place. The leads at the base of the transformer have been projected into the holes on the circuit board as the pusher block 98 has firmly pushed the transformer can against the circuit board. It will be noted from Fig. 5 that the pusher block is prevented from descending too far and from damaging the can by the stop pin 112 striking the frame piece 116. This limits the downward movement of the sliding yoke 106 and the positioning box 78 supported thereon. The pusher block, resting on the upper shoulders 124 and 126 of the box, can descend no farther.

When the transformer can 76 has been thus mounted on the circuit board, the air valve operates automatically to admit air to the bottom of the cylinder 102, and the pusher block 98 is lifted as the piston rod 100 begins to ascend. In the first portion of its ascension, the block 98 lifts away from the positioning box 78 in the manner shown in Fig. 6. Although the springs 132 and 134 exert an upward pull on the box supporting plate 104, they have sufficient strength only to counterbalance the weight of the yoke but will not overcome the friction between the yoke 106 and the guide posts 108 and 110 and the box 78 will not follow the pusher block 98 as it moves upwardly.

When the block reaches the lifting stops 146 and 148 which are secured to the box supporting plate 104, as is shown in Figs. 1 and 3 to 6, it begins to lift the yoke 106 with its associated plate 104 and positioning box 78. The transformer can 76 is held to the board by its spring clips 44 and 46 so it is not lifted from the board when box 78 lifts.

The piston rod 100 continues its ascent until the upper stop 114 strikes the frame plate 118, at which point the pusher block 98 and the yoke 106 are in their return position of Figs. 1 and 3.

During the ascent of the pusher block and sliding yoke, the transformer can feed mechanism is operated to deliver a new can for mounting on the next circuit board. To accomplish this, a feeder actuator pin 150, Fig. 3, projects upwardly from the top of the yoke 106. The feeder actuator is secured to the yoke and slides in an opening in the frame piece 118. As the actuator 150 raises, it strikes a feeder crank 152 which is secured to a feeder shaft 154. The feeder shaft is pivotally mounted on a bracket 156 on top of the frame plate 118 as is shown in Figs. 3 and 5.

Turning to Fig. 3, it will be seen that rotational movement of the feeder shaft 154 will swing a feeder bar supporting arm 158 forwardly to cause the feeder bar 64 to kick the lowermost transformer can out from beneath the stack of cans in the magazine.

Thus it will be seen with reference to Fig. 3 that as the feeder actuator plunger moves upwardly, it pivots the feeder crank 152 from the dotted line position to the solid line position, which in turn pivots the arm 158 from the dotted to the solid line position. As the feeder bar 64 moves from the dotted to the solid line position, the lowermost can 58 is kicked out from beneath the stack and slides down the chutes 68 and 66 to drop into the positioning box in an upright position where it is ready for the next operation of the machine.

When the lowermost transformer can is kicked out from beneath the stack of cans in the magazine the entire stack will drop down to settle on the feeder bar 64 which temporarily supports the stack. The bar will remain in the solid line position of Fig. 3 to support the stack while the delivered can is sliding down the chutes and is in upright position in the positioning box. Then the plunger will begin to descend, and only when it engages the positioning box and pushes the sliding yoke downwardly, will the feeder bar return to the dotted line position to let the stack of cans drop downwardly to rest on the floor 70. A tension spring 159 is connected between the frame 118 and the supporting arm 158 to return the feeder bar when the yoke descends.

In operation, the entire motion of mounting the can and the return of the pusher block with the feeding of a subsequent can are completed in a very short time. As the can slides down the feeding chute, a shield 160 is provided, being secured to the pusher block 98 to prevent the can from bouncing off the waterfall chute 66 or from accidentally catching on the top surface of the pusher block 98. As the can slides down against the pusher block before it has completely ascended, it will merely engage the shield 160, permitting the pusher block 98 to complete its ascent with the transformer can sliding into the positioning box beneath the block.

Thus it will be seen that the mechanism provided consists of relatively few parts, each of which are sturdy, with the moving parts comprising the pusher block, the positioning box, and the feeder mechanism. This arrangement enables extended periods of operation without the danger of wear or disturbance of critical adjustments which would interrupt the operation of the machine. It will readily be seen that each of the parts is rugged and that critical adjustment is not necessary. The machine is capable of operating rapidly without the danger of jamming or injury to the transformers or transformer containers.

I have, in the drawings and specification, presented a detailed disclosure of the preferred embodiment of my invention. It is to be understood that the invention is susceptible of modifications, structural changes and various applications of use within the spirit and scope of the invention and I do not intend to limit the invention to the specific form disclosed but intend to cover all modifications, changes and alternative constructions and methods falling within the scope of the principles taught by my invention.

I claim as my invention:

1. A mechanism for mounting electrical component containers on a circuit board comprising means for supporting a component container before it is mounted on said circuit board, means for feeding the component container to said supporting means, a pusher member movable toward and away from said circuit board, said pusher member having means engageable with said component container to move the container within said supporting means so that said container is in an inserting position beyond said supporting means, resilient means connecting said supporting means to said pusher means for restraining movement of said supporting means until said pusher member has moved the container to said extended position, said pusher member having means engageable with said supporting means to move said supporting means and extended container to said circuit board for insertion of said container, means for moving said pusher member toward and away from said board, and means mounted on said supporting means in the path of the return movement of the pusher member to return said supporting means with said pusher member in preparation for supporting a subsequent component container from said feeding means.

2. A mechanism for mounting on a circuit board an electrical component which has axially projecting attachment means at one end with each component projecting perpendicularly out from its board, and with said attachment means projecting into the board, said mechanism comprising, in combination: means for conveying a circuit board along a path generally in the plane of the board to an attaching position under said mechanism, a supporting member for receiving a component and for guiding it toward said circuit board, means mounting said supporting member for reciprocating movement in a direction perpendicular to said board between an inserting position immediately adjacent the board and a component receiving position in which the supporting member is spaced from the board, said supporting member having retaining means initially holding a received component in a retracted position in said supporting member, said retaining means being movable in response to pressure of the component toward the board and thereby providing limited relative movement of the component in the supporting member to a projecting position in which the component is positioned in exact desired alignment and its attachment means projects toward the board beyond the supporting member, a pusher member also mounted for reciprocating motion toward and away from said circuit board in a direction perpendicular to said board, a first portion on said pusher member engaging a component in receiving position and moving the component relative to said supporting member from retracted to projecting position in said supporting member during initial movement of the pusher toward the board, a second portion on said pusher member thereafter engaging said supporting member and said first and second portions then moving the component and supporting member as a unit toward the circuit board until the component is inserted in said board in response to further movement of the pusher toward the board, resilient means connecting said pusher member and supporting member and resiliently retaining said supporting member in receiving position until said first pusher member portion has completed said relative movement of the component toward the board to its projecting position and said second portion has engaged said supporting member, and a further portion on said pusher member engaging said supporting member on return movement of the pusher and positively moving the supporting member away from said circuit board to its receiving position for removal of said circuit board and attached component along said path.

References Cited in the file of this patent

UNITED STATES PATENTS

| | | |
|---|---|---|
| 753,281 | Maenche | Mar. 1, 1904 |
| 1,094,163 | Nissinen et al. | Apr. 21, 1914 |
| 2,242,532 | Marx | May 20, 1941 |
| 2,461,290 | Maynard et al. | Feb. 8, 1949 |
| 2,748,388 | Cardani | June 5, 1956 |
| 2,762,046 | Wright et al. | Sept. 11, 1956 |